United States Patent
Yang et al.

(10) Patent No.: US 7,749,855 B2
(45) Date of Patent: Jul. 6, 2010

(54) CAPACITOR STRUCTURE USED FOR FLASH MEMORY

(75) Inventors: Nian Yang, Mountain View, CA (US); Yonggang Wu, Santa Clara, CA (US); David Aoyagi, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 188 days.

(21) Appl. No.: 11/838,483

(22) Filed: Aug. 14, 2007

(65) Prior Publication Data
US 2009/0045445 A1 Feb. 19, 2009

(51) Int. Cl.
*H01L 21/8247* (2006.01)
(52) U.S. Cl. .............................. 438/393; 257/E21.693
(58) Field of Classification Search .......... 257/E21.683, 257/E21.691; 438/393
See application file for complete search history.

(56) References Cited

U.S. PATENT DOCUMENTS

| | | | |
|---|---|---|---|
| 5,589,697 A | 12/1996 | Smayling et al. | |
| 5,814,850 A * | 9/1998 | Iwasa | 257/296 |
| 6,026,003 A | 2/2000 | Moore et al. | |
| 6,069,825 A | 5/2000 | Tang | |
| 6,104,053 A * | 8/2000 | Nagai | 257/303 |
| 6,184,594 B1 | 2/2001 | Kushnarenko | |
| 6,943,402 B2 * | 9/2005 | Nagasaka et al. | 257/316 |
| 2006/0065913 A1* | 3/2006 | Sakuma et al. | 257/202 |
| 2007/0063257 A1* | 3/2007 | Hur et al. | 257/315 |
| 2007/0267685 A1* | 11/2007 | Ishibashi | 257/316 |

* cited by examiner

*Primary Examiner*—Sue Purvis
*Assistant Examiner*—Benjamin P Sandvik
(74) *Attorney, Agent, or Firm*—Eschweiler & Associates, LLC

(57) ABSTRACT

A method of forming a capacitor for use as a charge pump with flash memory, comprising: (a) concurrently forming polysilicon gates on a semiconductor body in a core region and a polysilicon middle capacitor plate in a peripheral region, (b) forming a first dielectric layer over the polysilicon gates and the middle capacitor plate, (c) planarizing the first dielectric layer to expose a top portion of the polysilicon gates and a top portion of the middle capacitor plate, (d) forming a second dielectric layer over the top portion of the middle capacitor layer, (e) concurrently forming patterning a second polysilicon layer in the core region and a third capacitor plate in the periphery region and (f) connecting the third capacitor plate to the source/drain well.

5 Claims, 12 Drawing Sheets

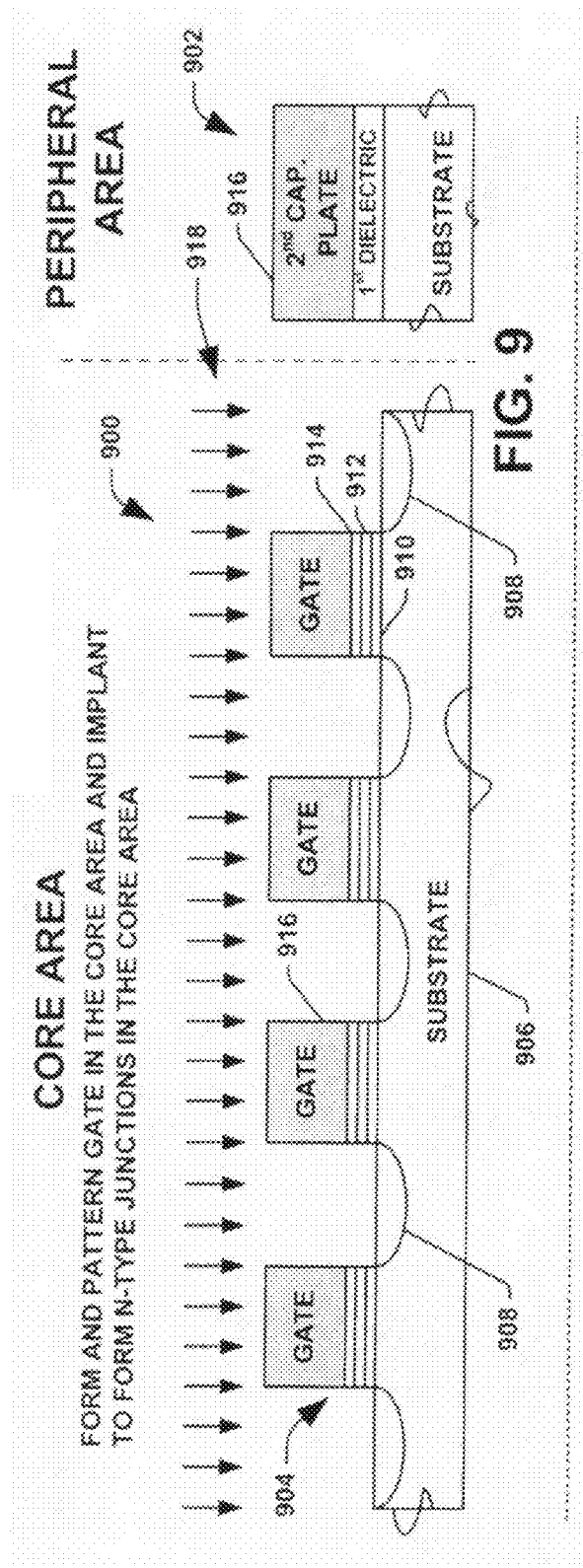
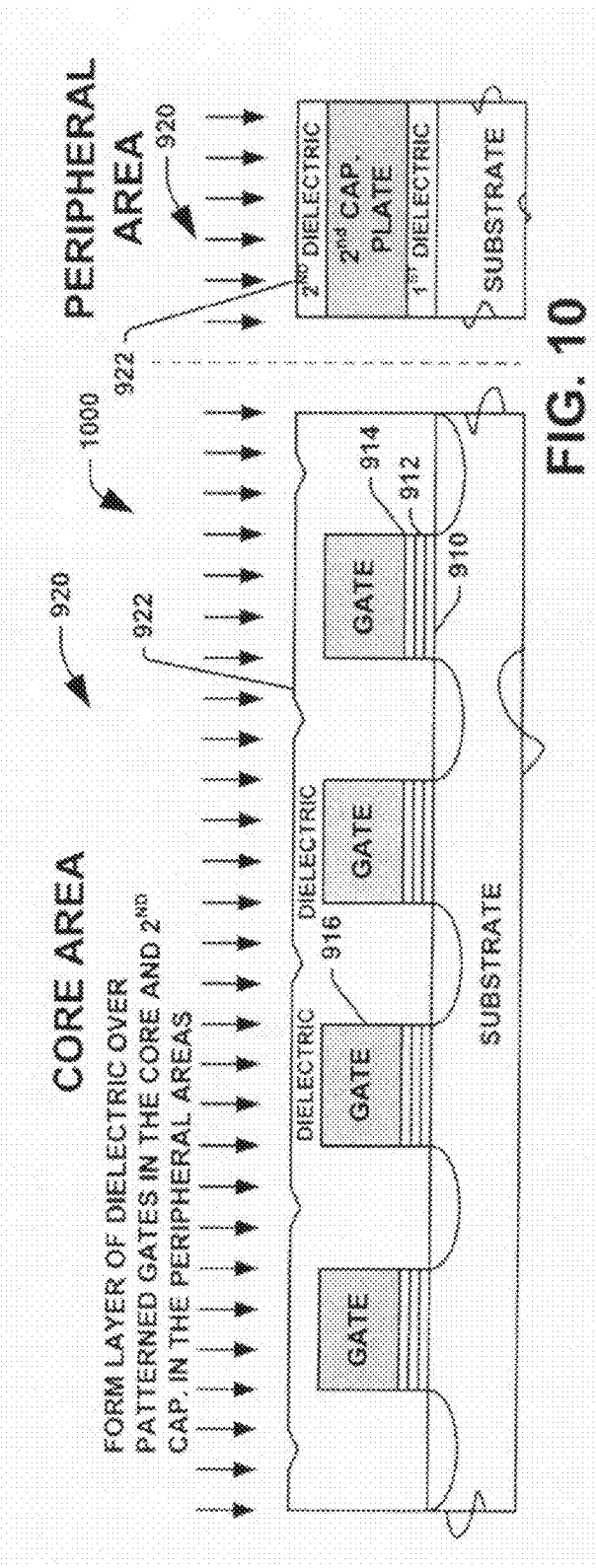

CAPACITOR STRUCTURE USED FOR FLASH MEMORY

FIELD OF INVENTION

The present invention relates generally to systems and methods of concurrently fabricating capacitors and flash memory, and in particular to systems and methods of manufacturing capacitors with a reduced capacitor footprint on a semiconductor device and yet the same amount of capacitance achieved with current capacitors with a larger footprint.

BACKGROUND OF THE INVENTION

Current high performance flash memory devices such as ORNAND, NOR, NAND devices, and the like, can achieve a packaging density substantially higher than the conventional EEPROM non-volatile memory. For example, flash memory devices are suitable for mass storage and/or code storage in commercial, as well as consumer products. As the density of the devices increases, the performance of the ORNAND type of flash memory can also improve. In order to efficiently manage the full chip performance and to effectively use the silicon die area, power, for example, from one area of the die must be handled and transferred to another area with care, especially when dealing with high voltage (HV) signals. The IR effects (current×resistance) become an important factor affecting power consumption, silicon die size, high voltage operation, and the like. The penalty of using extra silicon area, for example, causes large IR drop along the paths, power as well as signal transfer becomes more expensive and even prohibitive in some cases, and the like.

Flash memory devices typically require high voltage circuits to operate program and erase operations, which can consume large currents. Therefore, many devices employ charge pump circuits to generate high voltages to make the devices functional. Capacitors are used to achieve charge pumping via capacitive coupling and regulation, where the charge can be stored in capacitors and transferred from one stage of the pump to the next stage. As a key element of the charge pump, the capacitors may occupy much more silicon area compared to other components in the circuit design.

In view of the foregoing, a need exists to improve the design and efficiency of the capacitors in order to reduce the circuit size and the related parasitic capacitance, for example. This will in turn lead to silicon area savings, die size reduction and improved economy of the product.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention, in one embodiment, is directed to a method of forming a capacitor for use as a charge pump with flash memory, comprising:

(a) concurrently forming polysilicon gates on a semiconductor body in a core region and a polysilicon middle capacitor plate in a peripheral region, (b) forming a first dielectric layer over the polysilicon gates and the middle capacitor plate, (c) planarizing the first dielectric layer to expose a top portion of the polysilicon gates and a top portion of the middle capacitor plate, (d) forming a second dielectric layer over the top portion of the middle capacitor layer, (e) concurrently forming patterning a second polysilicon layer in the core region and a third capacitor plate in the periphery region, and (f) connecting the third capacitor plate to the source/drain well.

The present invention, in another embodiment, pertains to a method of forming a capacitor connected to a memory device creating a high voltage charge pump comprising forming at least one flash memory device on a semiconductor substrate, forming concurrently at least one capacitor on the semiconductor substrate comprising the method of forming at least one source/drain well in the semiconductor device, forming a first dielectric layer on the at least one source/drain well, forming a second capacitor plate on top of the first dielectric layer, forming a second dielectric layer on the second capacitor plate, forming a third capacitor plate on top of the second dielectric layer and connecting the third capacitor plate to the source/drain well.

The present invention, in yet another embodiment, pertains to a communication device, comprising a flash memory CPU, flash memory operatively coupled to the CPU and configured to transfer data to and from the CPU, an input component for entering the data, a display component for displaying information, a plurality of switches, a high voltage charge pump and the high voltage charge pump is made of capacitors formed by a method of forming a source/drain well in a semiconductor device, forming a first dielectric layer on the source/drain well, forming a gate on top of the first dielectric layer in a core region, forming a second dielectric layer oil a second capacitor plate in a peripheral region, forming a third capacitor plate on top of the second dielectric layer and connecting the third capacitor plate to the source/drain well.

The present invention in another embodiment, pertains to a capacitor device for use as a charge pump with flash memory, comprising an arrangement of polysilicon gates on a semiconductor body in a core region and a polysilicon middle capacitor plate in a peripheral region, wherein a first dielectric layer is formed over the polysilicon gates and the middle capacitor plate, wherein the first dielectric layer is planarized to expose a top portion of the polysilicon gates and a top) portion of the middle capacitor plate, wherein a second dielectric layer is formed over the top portion of the middle capacitor layer, wherein a second polysilicon layer is concurrently formed and patterned in the core region and a third capacitor plate in the periphery region and wherein the third capacitor plate is connected to the source/drain well.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 9 is an exemplary illustration of a concurrent memory and capacitor formation according to yet another aspect of the present invention;

FIG. 10 is an illustration of concurrent fabrication of memory and high voltage charge pump, peripheral circuits, according to another aspect of the current invention;

DETAILED DESCRIPTION OF THE INVENTION

Figure 1:
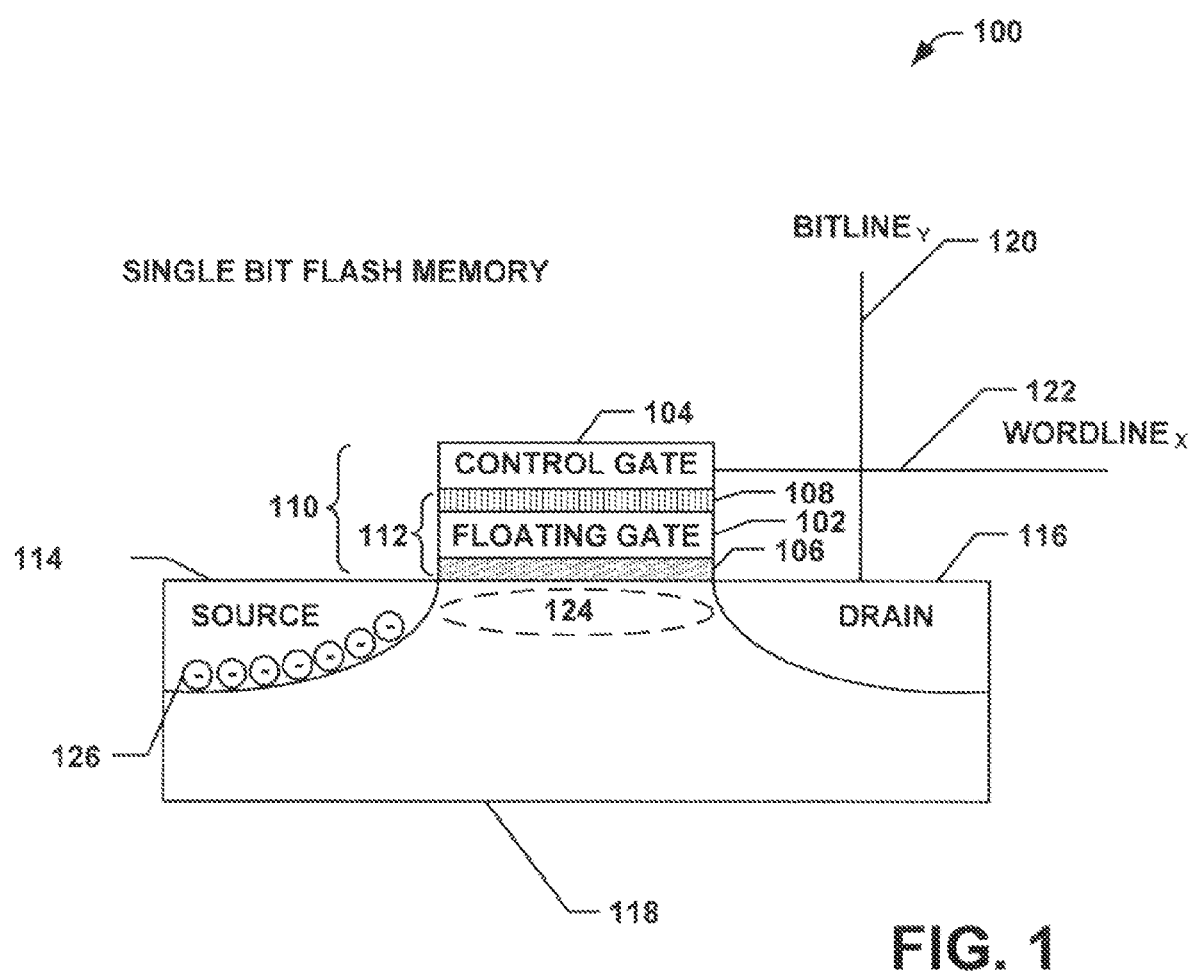
FIG. 1 is a cross-sectional view illustrating a single bit stacked gate flash memory cell according to one exemplary embodiment of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention. The present invention, in a further embodiment, is directed to a method for fabricating an increased capacitance structure in accordance with the invention. The technique is used manufacturing capacitors in an efficient manner requiring less surface area than the current alt.

It should be noted that FIGS. 1-7 are provided to understand memory cells that are formed within a core region with capacitors that are formed concurrently in a peripheral region. Referring now to the figures in detail, FIG. 1 is a cross sectional illustration of a stacked gate type flash memory cell 100 that may be employed in accordance with one aspect of the present invention. It is to be appreciated that although the explanation with respect to FIG. 1 is a cross sectional view of a single bit cell, with slight modification it can refer to a dual bit cell or a mirror-bit to be discussed in detail infra. The memory cell 100 can be fabricated, for example, by employing semiconductor processes including hundreds of manufacturing steps to fabricate the flash memory cell 100 within a cell memory core and surrounded by layers of electrical interconnections, a high voltage charge pump, etc., around the periphery. The flash memory cell 100 is constructed wherein data or information is stored within the flash memory cell 100 on a floating gate 102. The floating gate 102 can be a nitride layer with a thickness of approximately 5 to 10 nanometers, for example. The flash memory cells 100 can be constructed or layered on a semiconductor substrate 118 with a conducting bitline 120 (BITLINE$_Y$) attached to a drain 116. A conductive wordline 122 (WORDLINE$_X$), associated with a row of such cells, is connected to a control gate 104 that is formed over a composite charge trapping layer 112, and the WORDLINE$_X$ 122 is substantially perpendicular to a BITLINE$_Y$ 120 in a typical NOR (logical NOT OR) type configurations.

The conductive BITLINE$_Y$ 120 connects the various drains in the column of cells including the cell 100 that can be referred to as CELL$_{XY}$ 100. The basic flash memory CELL$_{XY}$ 100 is similar to a metal oxide semiconductor field effect transistor (MOSFET) that has been adapted to incorporate the isolated inner floating gate 102 (e.g., made of polysilicon) between the external control gate 104 and a silicon substrate (P-well) 118. The inner floating gate 102 functions as the data-storing element of the flash memory cell 100. A stacked gate 110 includes the floating gate 102 sandwiched between the tunnel oxide dielectric 106 and an isolation or control dielectric 108 upon which the control gate 104 resides. In other words the floating gate 102 is entirely insulated all around by oxide and the oxide-nitride-oxide layer 112, thus formed, is often referred to as an "ONO layer". A substrate channel 124 is formed between the source 114 and the drain 116 regions and conducts current between the source 114 and the drain 116 in accordance with an electric field formed within the channel 124 by a voltage applied to the WORDLINE$_X$ 122 (attached to the control gate 104) and a voltage applied to the BITLINE$_Y$ (attached to the drain 116). Typically, the source 114 terminal of each cell 100 is connected to a common source terminal. Any electrons 126 placed oil or within the floating gate 102 get "trapped" there, isolated by the surrounding oxide insulation, 106 and 108, and thus the floating gate 102 stores charge, indicative of words, data or other information. The oxide layers, 106 and 108 can be approximately about 3 nm to 12 nm, for example.

The floating gate 102 is typically comprised of a conductive material, for example, nitride, and the like, and is typically deposited on the tunnel oxide 106. The tunnel oxide 106 is deposited on the substrate channel assembly 124 or the P-well/substrate 118 and is thin, so that the likelihood of electrons tunneling across or through it (from the semiconductor channel 124 to the floating gate 102) is high. The tunnel oxide 106 can be made of Si, $SiO_2$, AlO and the like. The tunnel oxide 106 can be 7 nanometers, for example. Please note that the dimensions provided in this discussion as well as other embodiments are merely provided as examples and are not intended to limit the invention.

The programming circuitry controls one flash memory cell 100, for example, by applying a first voltage to the wordline 122, which acts as the control gate 104 voltage, and a second voltage to the bitline 120 which acts as the drain 116 voltage. The basic flash memory cell 100 is, for example, like an NMOS transistor that has been modified with the "floating" gate 102. The writing aspect of NOR memory cell 100 programming, for example, takes place to obtain a "0" bit when a positive voltage is applied to both the bitline 120 (associated with the drain 116) and the wordline 122 (control gate 104) simultaneously, the electrons 126 begin to flow from the source 114 region to the drain 116 region. As the electrons 126 flow from the source 114 to the drain 116, the large positive voltage placed on the control gate 104 provides an electrical field strong enough to draw electrons 126 through the tunnel oxide 106 and up into the floating gate 102, a process called channel hot-electron injection. The resultant high electric field across the tunnel oxide 106 results in a phenomenon called "Fowler-Nordheim" tunneling. During Fowler-Nordheim tunneling, electrons move from the source 114 into the channel region 124 and tunnel through the oxide layer 106 into the floating gate 102 and become trapped in the gate 102 since the floating gate is surrounded by oxide layers, 106 and 108. If the resultant negative charge on the floating gate 102 is above a selected threshold level, the bit is referred to as "programmed" and the cell 100 is defined as a "zero".

The flash memory cell 100 can employ two states, for example, a "written" or "programmed" state ("0" state) and an "erased" state ("1" state), in order to store data or information. The charge level "trapped" within or on the floating gate 102 determines the flash cell 100 state by shifting the threshold voltage (Vt) of the control gate 104 that allows current to flow from the source 114 to the drain 116. The change in the threshold voltage (and associated channel 124 conductance) of the cell 100 produced by the trapped electrons 124, as discussed supra, results in the cell being "programmed". To erase (reset the cells to all 1's) on the NOR flash cell 100, a large voltage differential is placed between the control gate 104 and source 114, which pulls the electrons off of the floating gate 102 through quantum tunneling. Most modern NOR flash memory components are made up of various "erase segments", usually called either "blocks" or "sectors". All of the memory cells 100 in a block are erased at the same time, however, NOR "programming" can generally be performed one byte or word at a time. An erased state "1" occurs when the charge of the floating layer or gate 102 does not influence the threshold voltage, or alternatively, a programmed state "0" is present when the charge level of the floating gate does sufficiently influence or change the threshold voltage of the control gate 104 beyond a predetermined level.

In single bit flash memory devices and systems, erase verification is performed to determine whether each cell in a block or set of cells has been appropriately erased. Present single bit erase confirmation methodologies and strategies afford verification of bit or cell erasure, and submission of additional erase pulses can be sent to individual cells that fail the verification process. Thereafter, the erased condition of the cell is again verified and the process continues until the cell or bit is successfully erased or the cell is "marked" as no longer viable.

Figure 2:
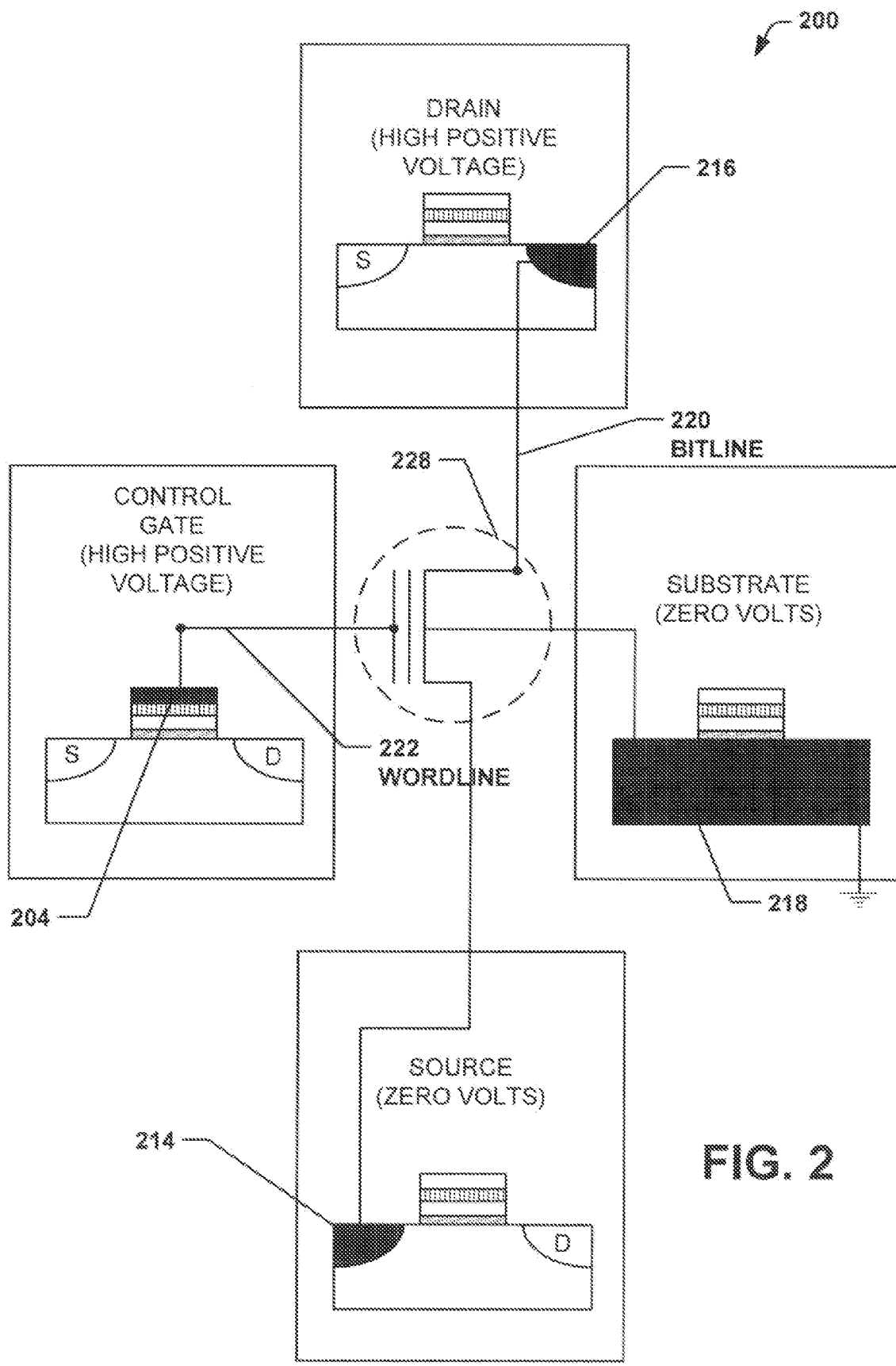
FIG. 2 is a pictorial illustration of a dual bit memory cell according to an exemplary aspect of the present invention.

Referring to FIG. 2, there is shown a schematic pictorial diagram of a known memory cell circuit 200 along with its associated exemplary cell diagram. An exemplary memory cell schematic 228 and the memory circuit 200 may be a component of a much bigger memory array or multiple memory arrays. Various circuits may be employed in order to connect the exemplary cell 228 to other cell arrays. Initially the exemplary cell 228 is biased by applying a relatively high positive voltage to a semiconductor drain 216 via a bitline 220, with a source 214 remaining at approximately zero volts. This results in the negative electrons flowing from the source 214 toward the drain 216, wherein the drain voltage 216 ($V_D$) is, for example, approximately three to five volts, for example, 4 volts. At approximately the same time a voltage of $V_G$ is applied to the control gate 204, approximately 9 volts, for example. The positive control gate 204 voltage causes some of the negative electrons to accelerate through the tunnel oxide and into the floating gate raising the negative potential of the floating gate and changing the threshold voltage. The floating gate "traps" or stores charges within its structure, which, can in turn, influence the "control behavior" of the control gate 204. Please note that the voltage levels provided in this discussion as well as other embodiments are merely provided as examples and are not intended to limit the invention.

Substrate 218 (shown as solid black) is also at zero potential as it is also connected to ground, as shown. The electrons flowing between the drain 216 and the source 214 define a region in the substrate called the current carrying channel. The biasable substrate 218 allows or facilitates charge flowing to the floating gate which in turn increases the field strength of the current carrying channel. Increasing the field strength decreases the barrier resistance of the tunnel oxide thereby making it easier for charges to overcome the tunneling resistance of the tunnel oxide. The stronger electric field also assists the current transmission in the current conducting channel permitting a reduction in the drain 216 voltage for flash memory operations, for example, programming, erasing, and the like.

Figure 3:
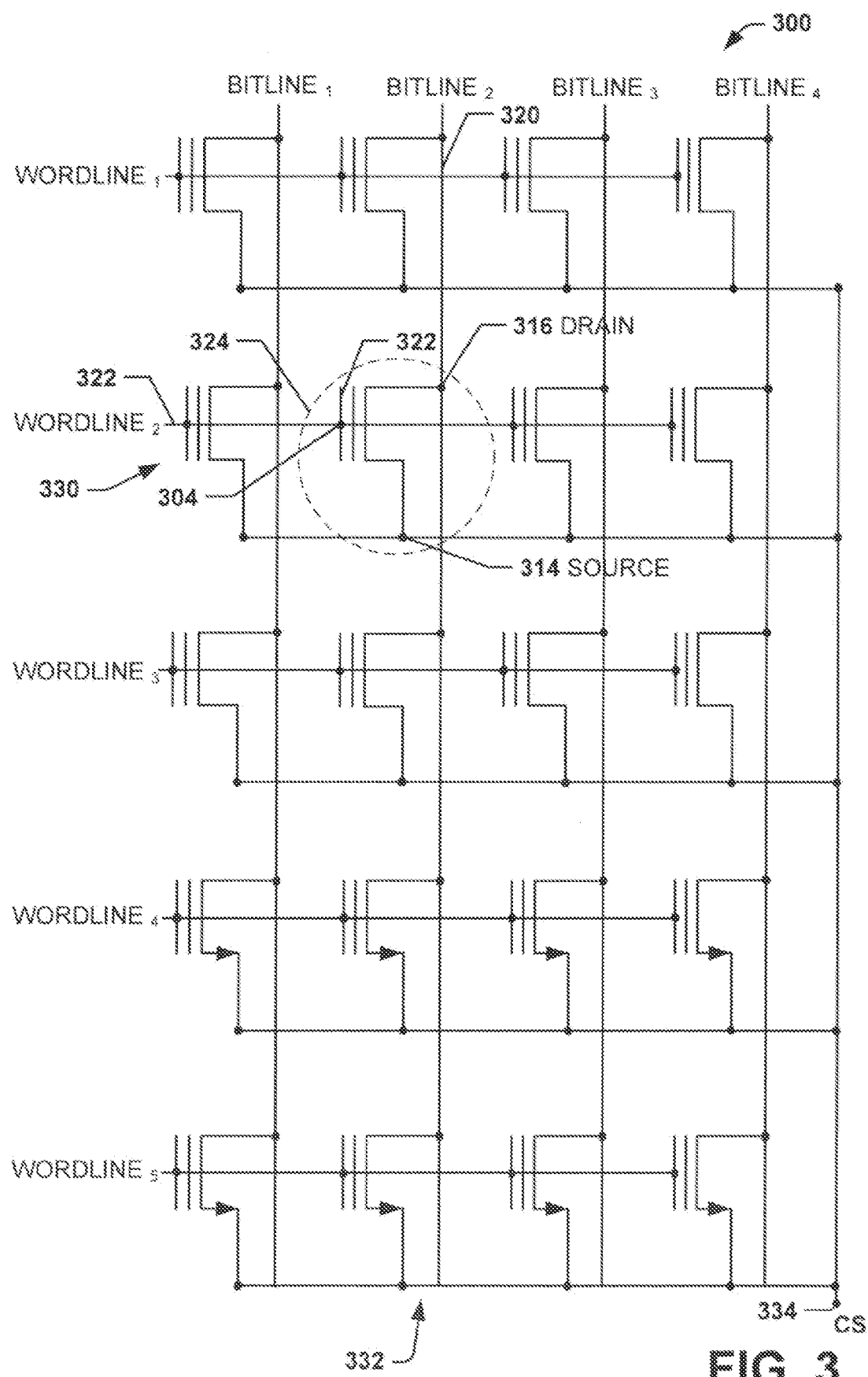
FIG. 3 is a schematic of an exemplary illustration of a partial sector array of wordlines and bitlines of flash memory cells in a NOR type architecture in accordance with one aspect of the present invention.

Referring now to FIG. 3, the figure illustrates a typical NOR configuration 300 of a partial array of flash memory cells, wherein with respect to, for example, an exemplary cell 324 ($CELL_{2,2}$), a control gate 304 is connected to a wordline 322 (e.g., $WORDLINE_2$, of $WORDLINE_1$-$WORDLINE_5$), wherein the wordline 322 is associated with a row 330 of such cells to form sectors of such cells. In addition, the drain regions of the cells are associated together by a conductive bitline 320 (e.g., $BITLINE_2$, of $BITLINE_1$-$BITLINE_4$). The channel of the cell conducts current between the source 314 and the drain 316 in accordance with an electric field developed in the channel by the stacked gate structure. In the NOR arrangement 300, each drain 316 terminal of the transistor 324 within a single column 332 of cells is coupled to the same bitline 320, e.g., $BITLINE_2$. In addition, each flash cell associated with a given bitline has its stacked gate terminal coupled to a different wordline (e.g., $WORDLINE_1$-$WORDLINE_5$), while all the flash cells in the array have their source terminals coupled to a common source terminal 334 (CS). In operation, individual flash cells are addressed via the respective bitline and wordline using, for example, a peripheral decoder and/or control circuitry for programming (writing), reading or erasing functions.

For example, the dual bit stacked gate flash memory cell 324 is programmed, for example, by applying a relatively high voltage to the control gate 304 and connecting the source 314 to ground and the drain 316 to a predetermined potential above the source 314. A resulting high electric field across the tunnel oxide leads to phenomena called "Fowler-Nordheim" tunneling that allows electrons in the core cell channel region to tunnel through the tunnel oxide into the floating gate and become trapped in the floating gate given that the floating gate is surrounded by the oxide dielectric and the tunnel oxide. As a result of the trapped electrons, the threshold voltage (Vt) of the cell 324 increases. This change in the threshold voltage (and thereby the channel conductance) of the cell 324 created by the trapped electrons is what causes the cell 324 to be programmed or set to "0".

In order to erase the typical dual bit stacked gate flash memory cell 324, a relatively high positive voltage is applied to the source 314, and the control gate 304 is held at a negative potential, while the drain 316 is allowed to float. Under these conditions, a strong electric field is developed across the tunnel oxide between the floating gate and the source 314. The electrons that are trapped in the floating gate, flow toward and cluster oil the portion of the floating gate, overlying the tunnel oxide, and are extracted from the floating gate and into the source 314 region by way of Fowler-Nordheim tunneling through the tunnel oxide. As the electrons are removed from the floating gate, the cell 324 is erased or set to "1".

For read operations, a certain voltage bias is applied across the drain 316 to source 314 of the cell transistor 324. The drain 316 of the cell 324 is connected to the bitline 320, which may be connected to the drains 316 of other cells 324 in a byte or word group. The voltage at the drain 316 in conventional stacked gate memory cells is typically provided at between 0.5 and 1.0 volts in a read operation. A voltage is then applied to the control gate 304 (e.g., the wordline 322) of the memory cell transistor 324 in order to cause a current to flow from the source 314 to the drain 316. The read operation control gate 304 voltage is typically applied at a level between a programmed threshold voltage (Vt) and an un-programmed threshold voltage. The resulting current is measured, by which a determination is made as to the data value stored in the cell 324.

Figure 4:
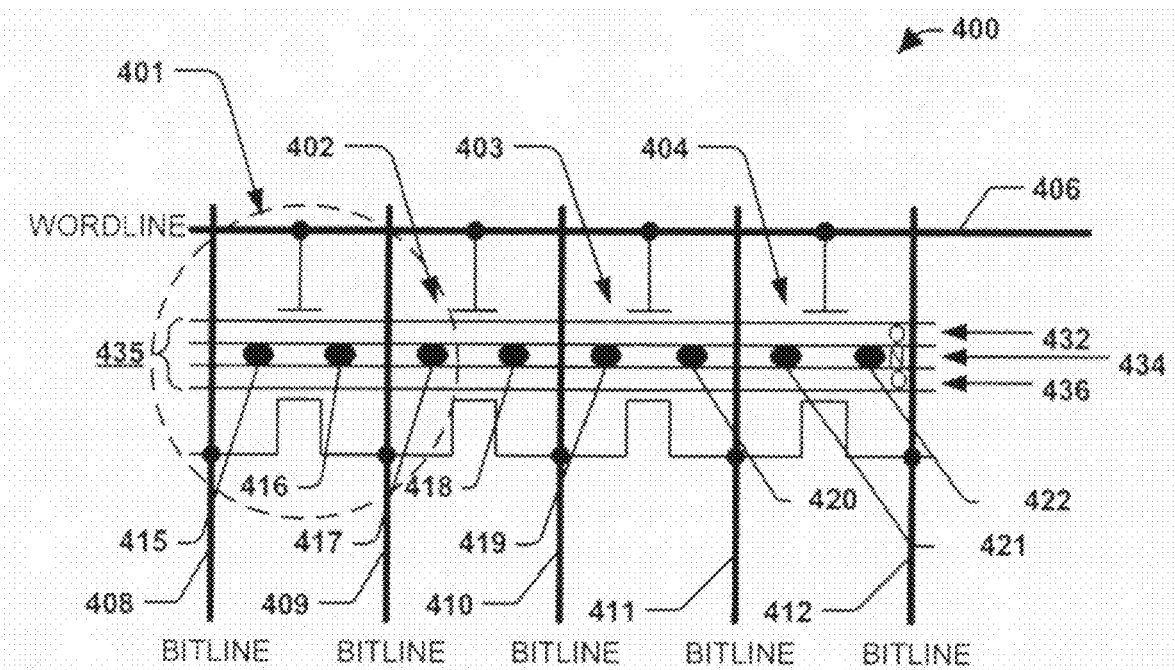
FIG. 4 is a schematic of a portion of a wordline and several associated bitlines in accordance with an aspect of the present invention illustrating as dual-bit type memory in a virtual ground type architecture.

Turning to FIG. 4, a schematic illustration is presented of a portion 400 of a memory core such as may include at least a portion of one of the M by N array cores that employs dual bit flash memory (which will be explained in detail infra). The circuit schematic shows a group of four memory cells 401 through 404 in a "virtual ground" type implementation, for example. The respective memory cells 401 through 404 are connected to a wordline 406, which serves as a control gate, and pairs of the memory cells share a common bitline. For instance, in the example shown, the memory cell 401 has associated bitlines 408 and 409; the memory cell 402 has associated bitlines 409 and 410; the memory cell 403 has associated bitlines 410 and 411; and the memory cell 404 has associated bitlines 411 and 412. As such, cells 401 and 402 share bitline 409, cells 402 and 403 share bitline 410 and cells 403 and 404 share bitline 411, respectively.

Depending upon wordline voltages and bitline connections, the memory cells 401 through 404 are capable of writing, reading, and erasing bits at locations 415 through 422. In addition to voltages applied to the wordline 406, control of the bit at location 415, for example, is achieved through connection of the drain to the bitline 408 and the source to the bitline 409. Similarly, control of the bit at location 416 is achieved through connection of the drain to the bitline 409 and the source to the bitline 408. Storage of multiple bits is made possible, at least in part, by a nitride layer 434 interposed between the bitlines and the wordline. The nitride layer 434 includes multiple insulating layers 432, 436 (e.g., oxide based material) that sandwich a charge trapping layer 434 (e.g., of nitride based material). Given its layer to layer composition, oxide-nitride-oxide, the dielectric layer 434 is often referred to as an ONO layer 435 in one example.

The ONO layer 435 allows the different bits to be stored at multiple states or levels as well. For example, depending upon the voltage applied to the memory cells 401 through 404 by the control gate or wordline 406 during programming, varying amounts of charge can be stored at locations 415 through 422. The different amounts of charge may correspond to different bit electrical states or levels, for example. If four different charge levels (e.g., 1, 2, 3 and 4) can be stored at each of the bit locations 415 through 422, for example, then each two-bit cell 401 through 404 can have 16 different combinations of stored data (e.g., 1-1, 1-2, 1-3, 1-4, 2-1, 2-2, 2-3, 2-4, 3-1, 3-2, 3-3, 3-4, 4-1, 4-2, 4-3 and 4-4).

Figure 5:
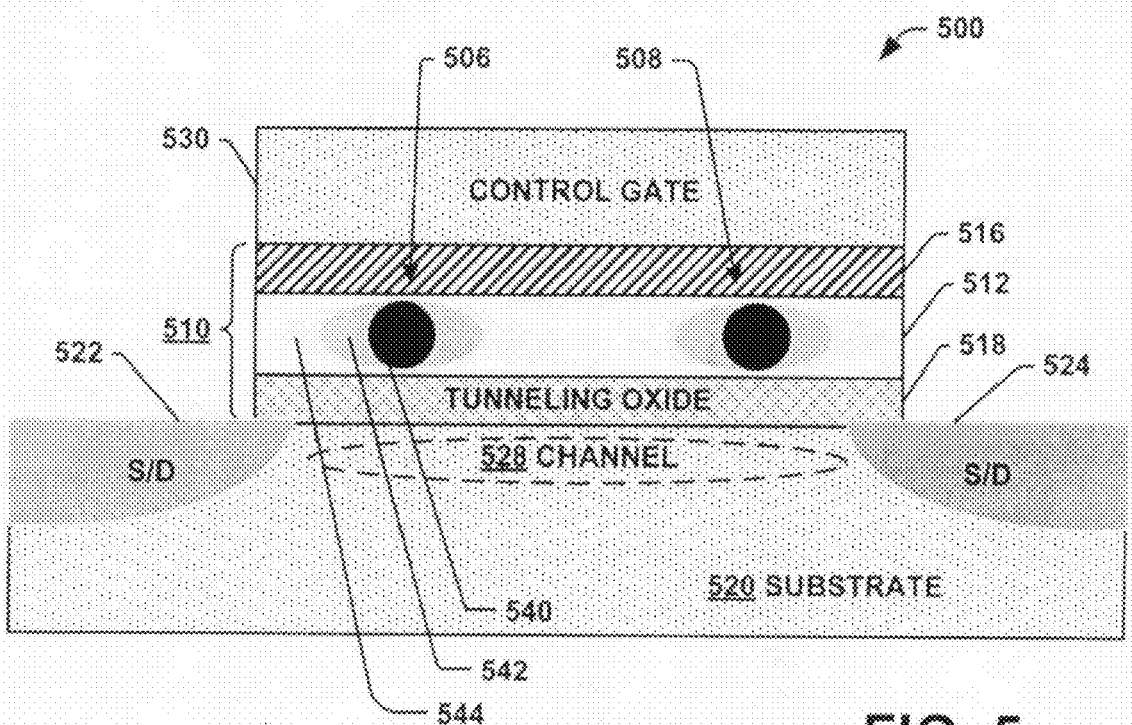
FIG. 5 is a cross-sectional view of a dual bit type flash memory cell wherein each of the bits can be potentially stored at multiple levels in accordance with an aspect of the present invention.

FIG. 5 is a cross sectional view of a dual bit memory cell 500 illustrating the capability of the cell to store varying degrees of charge at left and right dual bit locations 506, 508, according to an exemplary embodiment of the present invention. The dual bit flash memory cell 500 uses what is known in the alt as "virtual ground" architecture in which the source of one bit (e.g., left bit) serves as the drain of the adjacent bit (e.g., right bit). During read operations the junction nearest the bit being read is the ground terminal (source) and the other side of the cell is the drain terminal (drain), this is called "reverse read". It will be appreciated that the memory cell 500 may, for example, correspond to the memory cells 401 through 404 depicted in FIG. 4. The cell 500 includes a dielectric layer 510 that comprises a charge trapping layer 512 sandwiched between two dielectric layers 516 and 518. The charge trapping layer 512 is formed from one or more substantially non-conductive substances, such as nitride based materials. The dielectric layers 516, 518 are similarly formed from one or more electrically insulating substances, such as oxide based materials. The layer to layer arrangement, for example, oxide, nitride, oxide layer of the dielectric layer 510 often leads it to be referred to as an ONO layer.

The composite charge trapping layer 510 is formed over a semiconductor body or substrate 520 that may be formed from silicon or some other semiconductor material, for example. The substrate 520 may be selectively doped with a p-type dopant, such as boron, for example, to alter its electrical properties. In the example illustrated, the substrate 520 has buried bitlines or bitline diffusions including a first bitline diffusion 522 and a second bitline diffusion 524. The bitline diffusions 522 and 524 may, for example, be formed by an implanted n-type dopant, and may correspond to bitlines 408 through 412 in FIG. 4. A channel 528 is defined within the substrate between the first 522 and second 524 bitline diffusions (e.g., S/D extensions, deep S/D regions).

Overlying the upper dielectric layer 516 of the dielectric layer 512 is a gate 530 (control gate). This gate 530 may be formed from a polysilicon material, for example, and may be doped with an n-type impurity (e.g., phosphorus) to alter its electrical behavior. The gate may, for example, correspond to the wordline 406 in FIG. 4. The gate 530 enables a voltage to be applied to the cell 500 such that respective charges can, among other things, be stored within the cell at locations 506, 508, depending upon the electrical connections of the bitline diffusions 522, 524.

The dual bit memory cell 500 is generally symmetrical, thus the bitline diffusions 522 and 524 are interchangeable as acting source and drain. Thus, the first bitline diffusion 522 may serve as the source and the second bitline diffusion 524 as the drain with respect to right bit location 508. Likewise, the second bitline diffusion 524 may serve as the source and the first bitline diffusion 522 as the drain for the left bit location 506. The cell 500 can be programmed (set to "0") by applying a voltage across the gate 530 and an acting drain region 524, and connecting an acting source region to ground.

When programming the cell 500, the "acting" drain region 524 is typically biased to a potential above the "acting" source 522. As a result of the gate bias, a high electric field is applied across the charge trapping layer 512. Due to a phenomenon known as "carrier hot electron injection" (CHE), electrons pass from the acting source region 522 through the lower dielectric layer or tunneling oxide 518 and become trapped in the charge trapping layer 512 at locations 506 or 508. It will be appreciated that a second bit can be programmed to the alternate location 508 or 506 by reversing the acting source 522 and drain 524 and again applying a bias to the control gate 530.

By way of example, the left bit location 506 can be programmed by applying a program voltage to the gate 530 and a drain voltage to the second bitline 522, which is an acting drain for the left location 506. The first bitline 524, which is an acting source for programming the left bit location 506, can be, for example, connected to ground, left to float, biased to a different voltage level. The applied voltages generate a vertical electric field through the dielectric layers 518 and 516 and also through the charge trapping layer 512, and generate a lateral electric field across a length of the channel 528 from the first bitline diffusion 522 to the second bitline diffusion 524. At a given voltage, the channel 528 inverts such that electrons are drawn off the acting source 522 (the first bitline diffusion 524 in this example) and begin accelerating towards the acting drain 524 (the second bitline diffusion 522 in this example).

As the electrons move along the length of the channel 528, the electrons gain energy and, upon attaining enough energy, the electrons jump over the potential barrier of the bottom dielectric layer 518 and into the charge trapping layer 512, where the electrons become trapped. The probability of electrons jumping the potential barrier in this arrangement is a maximum in the area of the left bit location 506, adjacent the first bitline diffusion 522, where the electrons have gained the most energy. These accelerated electrons are termed hot electrons and, once injected into the charge trapping layer 512, stay in about the general area indicated for the left bit 506. The trapped electrons tend to remain generally localized due to the low conductivity of the charge trapping layer 512 and the low lateral electric field therein. Programming the right bit location 508 is similar, but the first bitline operates as an acting drain 524 and the second bitline operates as an acting source 522.

For a read operation, a certain voltage bias is applied across an acting drain 524 to an acting source 522 of the cell 500. The acting drain of the cell is a bitline, which may be connected to the drains of other cells in a byte or word group. A voltage is then applied to the gate 530 (e.g., the wordline) of the memory cell 500 in order to cause a current to flow from the acting source 522 to the acting drain 524. The resulting current is measured, by which a determination is made as to the value of the data stored in the cell. For example, if the current is above a certain threshold, the bit is deemed un-programmed or a logical "1", whereas if the current is below a certain threshold, the bit is deemed to be programmed or a logical "0". A second bit 508 can be read by reversing operations of the first and second bitline diffusions 522 and 524 for the acting drain and the acting source.

It can be appreciated that if the voltages utilized to program the left 506 and right 508 bit locations of the cell 500 are increased or sustained for longer periods of time, the number of electrons or amount of charge stored at these locations can be increased or otherwise varied. This allows the cell 500 to be utilized for additional data storage. For example, different amounts of charge can correspond to different programmed states. In the example illustrated, for instance, both the left 506 and right 508 bit locations can be said to have four different states or levels, namely 1, 2, 3 and 4, where level 1 corresponds to a situation where the locations are blank or un-programmed, and levels 2, 3 and 4 correspond to increased amounts of stored charge, respectively. With regard to the left bit location 506, for example, a level 2 may correspond to a relatively small amount of stored charge 540, while levels 3 and 4 may correspond to increasingly larger amounts of stored charge 542 and 544, respectively. This technique is also called multi-level cell technology, which is useful to increase density and reduce manufacturing costs.

Multi-level cells increase the effective cell density by increasing the number of possible logical states or data states associated with a cell, thereby allowing a single memory cell to store information corresponding to more than one data bit. One way this has been done is by using multiple (three or more, in the context of cell levels and states) threshold voltage (Vt) levels, which correspond to multiple data states per cell. This contrasts to the two states and levels used in conventional flash memory cells. Thus, in the example above, a single dual-bit cell may store two physical bits of data at each of four Vt levels corresponding to four logical states.

Figure 6:
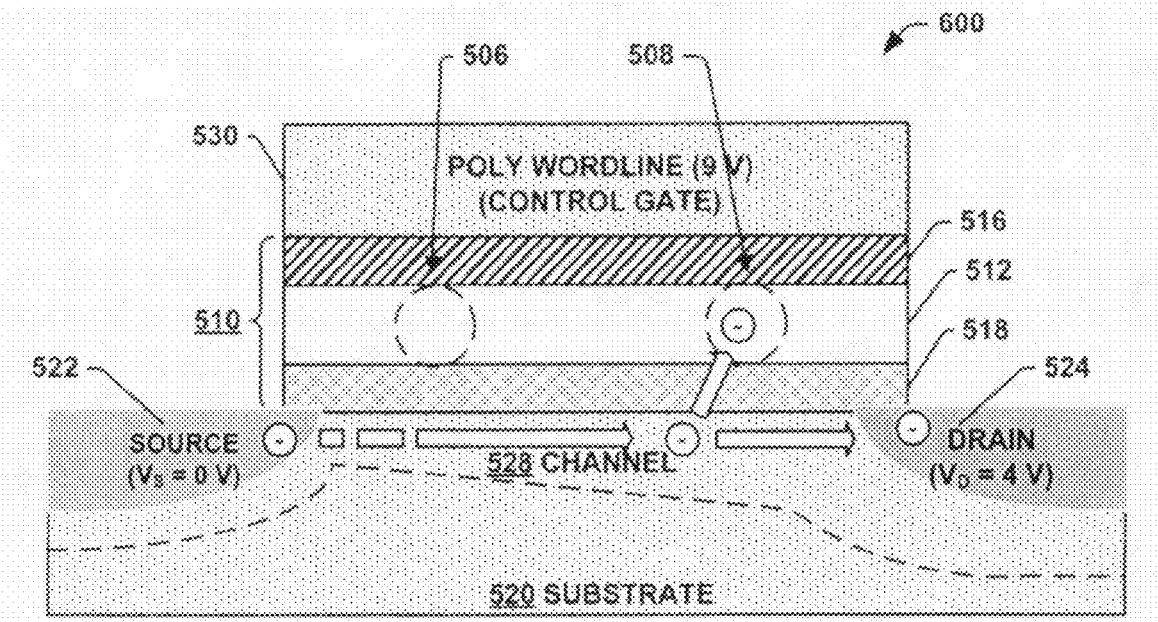
FIG. 6 is a schematic of an exemplary illustration of a dual bit memory cell programming a right bit in accordance with an aspect of the present invention.

A memory cell 600 in FIG. 6 illustrates programming or channel hot electron injection. The memory cell 600 can be made up of a floating gate 512 (nitride layer) sandwiched between an isolation oxide layer 516 and a tunnel oxide layer 518. As discussed supra, the charge is trapped in the nitride layer 512, that is not conducive and therefore the charge trapped therein can not move around freely in the layer 512. For example, a P-type substrate 520 has buried N+ source 522 and N+ drain 524 regions. The floating gate 516 is referred to as a charge trapping layer. Overlying the isolation oxide layer 516 is, for example, a polysilicon control gate 530. The control gate 530 can be doped with an N-type impurity (e.g., polysilicon). The memory cell 600 is capable of storing two data bits, a left bit 506 and a right bit 508 represented by the dashed circles. The dual bit memory cell 600 is generally symmetrical, thus the drain 524 and the source 522 are interchangeable. Thus, the left junction may serve as the drain 524 terminal and the right junction as the source 522 terminal with respect to the left bit 506. Likewise, the right junction may serve as the drain terminal 524 and the left junction as the source terminal 522 for the right bit 508. The control gate 530 can be supplied, for example, with a positive nine volts (9 V) by applying the voltage to an associated wordline. The drain 524 is then supplied with a positive four volts (+4 V), for example. The positive voltage on the control gate 524 attracts the electrons into the channel 528 and the drain 524 positive voltage attracts electrons 602, wherein the right bit area 508 is programmed. The electrons are trapped in the nitride layer 512 locally. The profile of electrons depends on the junction profile and the combination of wordline voltage/drain voltage. As illustrated in FIG. 6, the charge profile of the second programmed bit 508 is wider than the first programmed bit 506.

Figure 7:
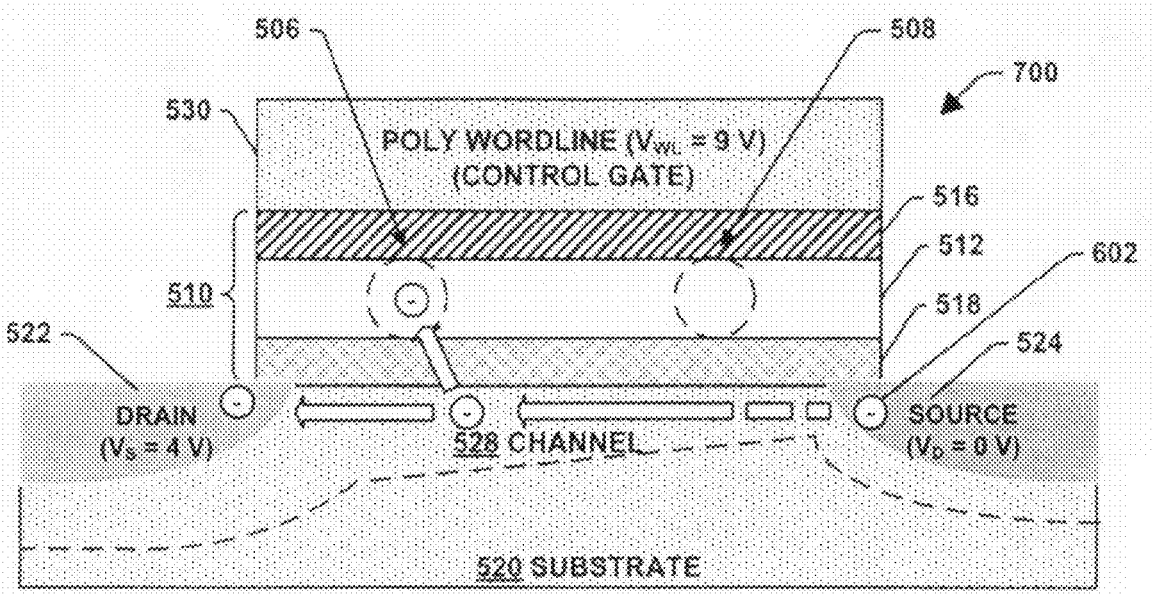
FIG. 7 is a schematic of an exemplary illustration of programming a left bit of a dual bit memory cell according to yet another embodiment of the present invention.

FIG. 7 illustrates a conventional programming method for programming a left bit 506 of a dual bit memory cell, at 700. The memory cell 700 can be made up of a floating gate 512 (nitride layer) situated in between a control oxide film 516 and a tunnel oxide film 518. The charge trapping layer or floating gate 512, for example, rests upon or bonds with the oxide film 518. A polysilicon control gate 530 can be a conductive polysilicon that is connected to a wordline, as mentioned above. The dual memory cell 700 can store at least two data bits, 506 and 508 shown in FIG. 7 as two dashed circles. The dual bit memory cell 700 is generally symmetrical, thus the drain 524 and the source 522 are interchangeable, although the memory cell 700 could be non-symmetrical, as well. Thus, the left area can serve as the transistor source 522 and the right area can serve as the transistor drain 524 with respect to the right bit 508. Likewise, the right junction may serve as the source terminal and the left junction as the drain terminal for the right bit 508. The control gate 530 can be supplied, for example, with a constant negative 9 volts by applying the voltage to an associated wordline. The source 522 is then supplied with a constant positive 4 volts, for example. The positive voltage oil the control gate 530 attracts electrons 536 onto the floating gate 512 and the source 522 positive voltage attracts the electrons, wherein the left bit area 506 is programmed.

Figure 8:
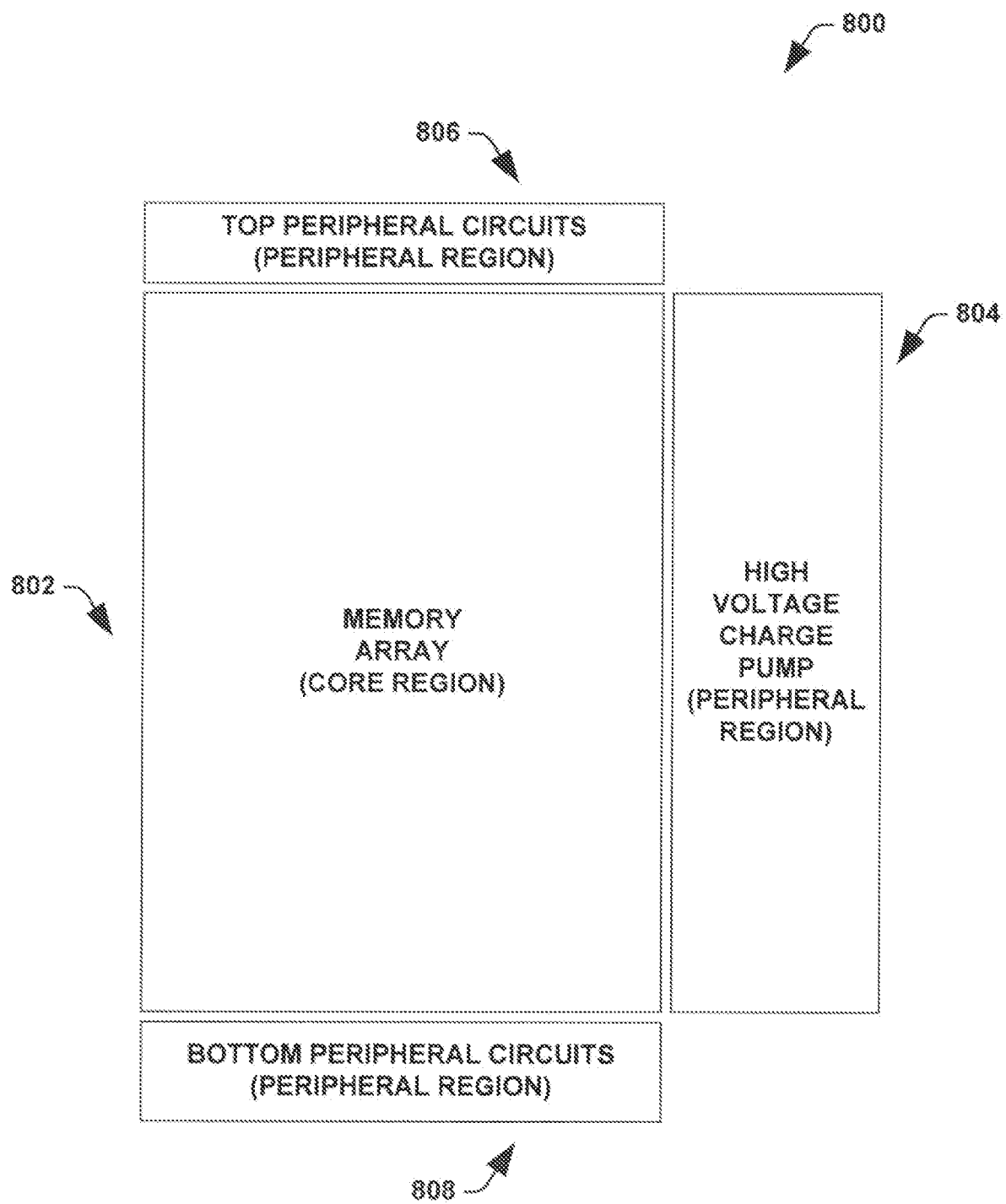
FIG. 8 is an illustration of an exemplary dual bit memory cell with a core region and a high voltage charge pump, peripheral region, according to yet another aspect of the present invention.
Figure 11:
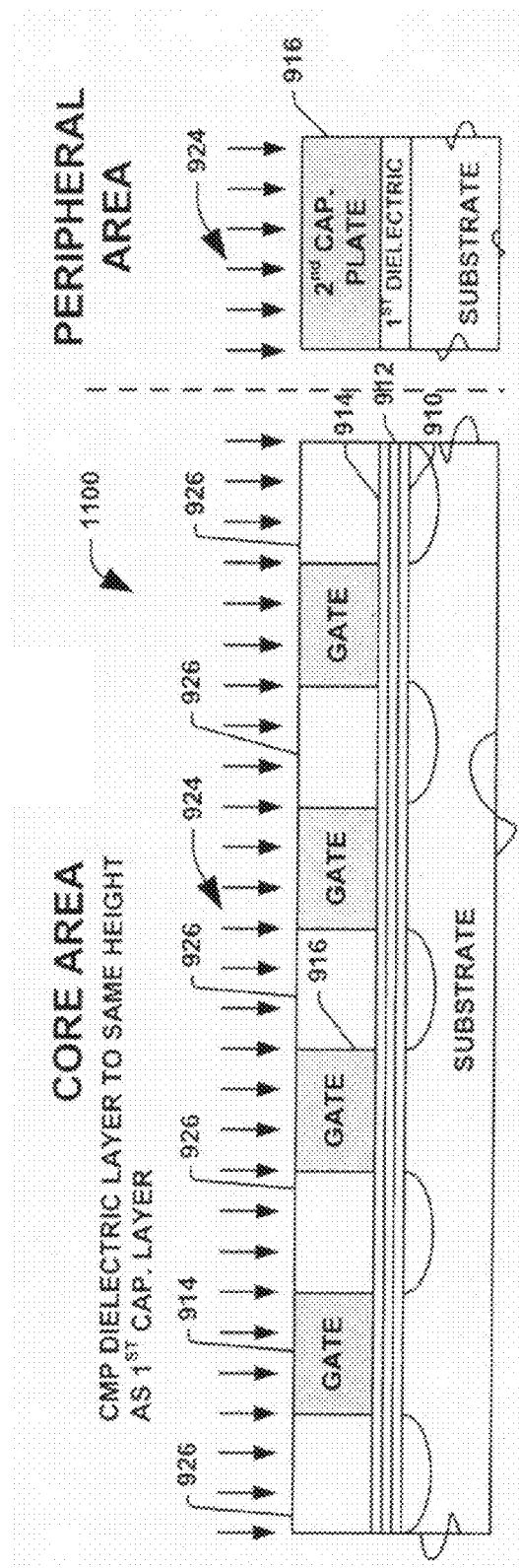
FIG. 11 is an illustration of a capacitor concurrently formed with memory cells, according to yet another aspect of the present invention.

FIG. 8 illustrates the die circuitry 800 surrounding a high-density core region or memory array 802, for example. The high-density core region 802 characteristically includes one or more M by N arrays of individually addressable, substantially identical dual bit flash memory cells. A high voltage charge pump 804 is shown in which a large area of the die is typically utilized. The inventors recognized that the capacitors could be created in a vertical configuration that would utilize a smaller footprint for the capacitors. Top peripheral circuits 806 and bottom peripheral circuits 808, referred to in total or partially as the peripheral region, partially surround the memory array 802. The lower-density peripheral regions can include input/output (I/O) circuitry and programming circuitry for selectively addressing the individual memory cells (e.g., programming, reading, and erasing, and deriving necessary voltages to effect such operations).

FIGS. 9-13 illustrate concurrent formation of memory cells and capacitors according to at least one aspect of the present inventions FIG. 9, for example, illustrates a cross-sectional side view of a partial exemplary capacitor 902 and memory devices 904 formed within a semiconductor device 900. The memory devices 904 and the partial capacitor 902 of the semiconductor device 900 can be formed on a common substrate or semiconductor body 906, for example. The partial capacitor 902 is formed concurrently with the memory devices 904. The semiconductor substrate 906 upon which the memory device 904 is formed can be doped with an n-type impurity such as arsenic or phosphorous, for example, to establish a threshold adjustment implant (Vtadjust) region therein. The threshold adjustment implant provides a region that is more heavily doped than the semiconductor substrate 906. The threshold adjustment implant assists in controlling a threshold voltage of the various cells within the memory device 904. It should be apparent to those of ordinary skill in the art that other semiconductor bodies can be used instead of the substrate (e.g., SOI), composite workpieces, and the like are contemplated within this invention.

A charge-trapping composite dielectric layer can be deposited over the semiconductor substrate 906, for example. The charge-trapping composite dielectric layer generally can be composed of three separate layers, for example: a first insulating layer 910, a charge-trapping layer 912, and a second insulating layer 914. The first and second insulating layers 910 and 914 are typically formed of an oxide dielectric such as silicon dioxide ($SiO_2$) and the charge-trapping layer 912 is generally formed of a nitride dielectric such as silicon nitride ($Si_xN_y$). The oxide-nitride-oxide con figuration is commonly referred to as an ONO layer for convenience. Alternatively, other types of charge-trapping layers may be employed and are contemplated as falling within the scope of the present invention.

It is to be appreciated that reference to substrate or semiconductor substrate 906 as used herein can include a base semiconductor wafer (e.g., silicon, SiGe, or an SOI wafer) and any epitaxial layers or other type semiconductor layers formed thereover or associated therewith. It is to be further appreciated that elements depicted herein are illustrated with particular dimensions relative to one another (e.g., layer to layer dimensions and/or orientations) for purposes of simplicity and ease of understanding, and that actual dimensions of the elements may differ substantially from that illustrated herein.

A layer of polysilicon based material(s) (i.e., shown herein after patterning) can then formed over the ONO composite charge trapping dielectric layer, for example. The polysilicon layer can be formed to a thickness of between about 500 to 1100 Angstroms, for example. A layer of hardmask material can be subsequently formed over the polysilicon layer. An optional antireflective coating (ARC) layer (not shown); that may include an organic material, such as silicon nitride or silicon oxynitride, for example, can be formed over the hardmask, and a photoresist (also not shown) can be formed over the ARC layer to facilitate patterning the hardmask. The ARC layer in particular assists with mitigating reflection during exposure and thereby improves the fidelity of pattern transfer. The hardmask can, for example, be formed from oxide based material(s) that are applied to a thickness of between about 300 to 700 Angstroms, for example.

The hardmask can then be patterned (e.g., after both the resist and optional ARC layers have been patterned, exposed, etched and/or selectively stripped to form a combined photo-mask for transferring the pattern onto the hardmask). An optional spacer material (e.g., of oxide and/or nitride based material) can be formed over the patterned hardmask features, for example. The spacer material can be formed to a thickness of between about 200 to 500 Angstroms, for example. The spacer material can then be patterned (e.g., isotropically plasma etched) to form sidewall spacers adjacent to the patterned features of the hardmask, for example.

The polysilicon layer can then be patterned with the sidewall spacers serving as guides, for example. It will be appreciated that from a three dimensional perspective the polysilicon layer (e.g., referred to as gates in the core region (FIGS. 8 and 9) can be patterned into parallel "strips" or wordlines 916 of polysilicon material. The gates 916 and the second capacitor plate 917 can be the same layer of material (e.g., polysilicon) or can consist of two separate or different layers of material, for example. It should be appreciated that the substrate layer or semiconductor body illustrated in FIGS. 9-13 serves as a first capacitor plate. The composite charge trapping dielectric layer 608 can be similarly patterned. It will be appreciated that the etchants utilized to remove the first 910 and second 914 dielectric layers can also be effective to remove the patterned hardmask features and the optional sidewall spacers since these features contain the same or a similar type of compound, namely oxide based materials. Should some traces of the hardmask features remain, these can be stripped or washed away at a later time to reveal a clean patterned poly1 layer in the memory device 904 located in the core region. It should be noted that the second capacitor plate in the peripheral region can remain un-patterned at this time in the processing of the capacitor 902, according to at least one aspect of the present invention. According to yet another aspect of the present invention, an implant 660 can optionally be then performed to establish n-type junctions (e.g., arsenic or phosphorus) within the p-well of the semiconductor substrate or body 906. These implantation techniques are well known by those of ordinary skill in the art.

In FIG. 10, for example a dielectric deposition 920 can then be performed with an oxide based material to form a dielectric layer 922. The high temperature oxide deposition 920 can be performed at temperatures between around 700 to 1200 degrees Celsius, for example. The deposition is performed to fill the openings within the memory devices 906 formed within the polysilicon wordlines 916 with the oxide material. The entire wafer (e.g., the core and peripheral regions) can then be subjected to planarization or chemical mechanical polishing (CMP) 924 (FIG. 11) to remove any excess oxide material and planarize the surface of the structures thereon. The dielectric layer can be polished 924 to the original height of the gate in the core region and the second capacitor plate (e.g., 914 and 916 respectively). It will be appreciated that in a three dimensional perspective this results in "strips" of oxide material 926 in parallel with the patterned strips of the polysilicon (914) or the polysilicon (916).

Figure 12:
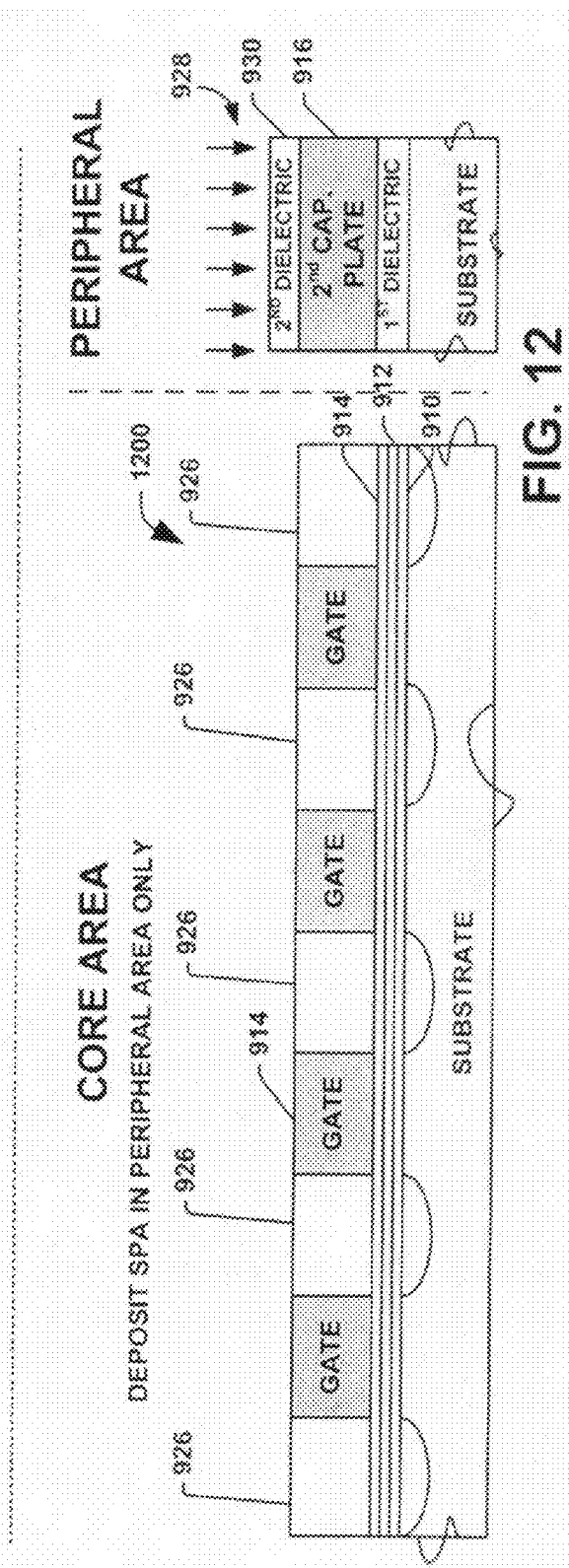
FIG. 12 is an illustration of concurrent fabrication of memory and high voltage charge pump, peripheral circuits, according to another aspect of the current invention.
Figure 13:
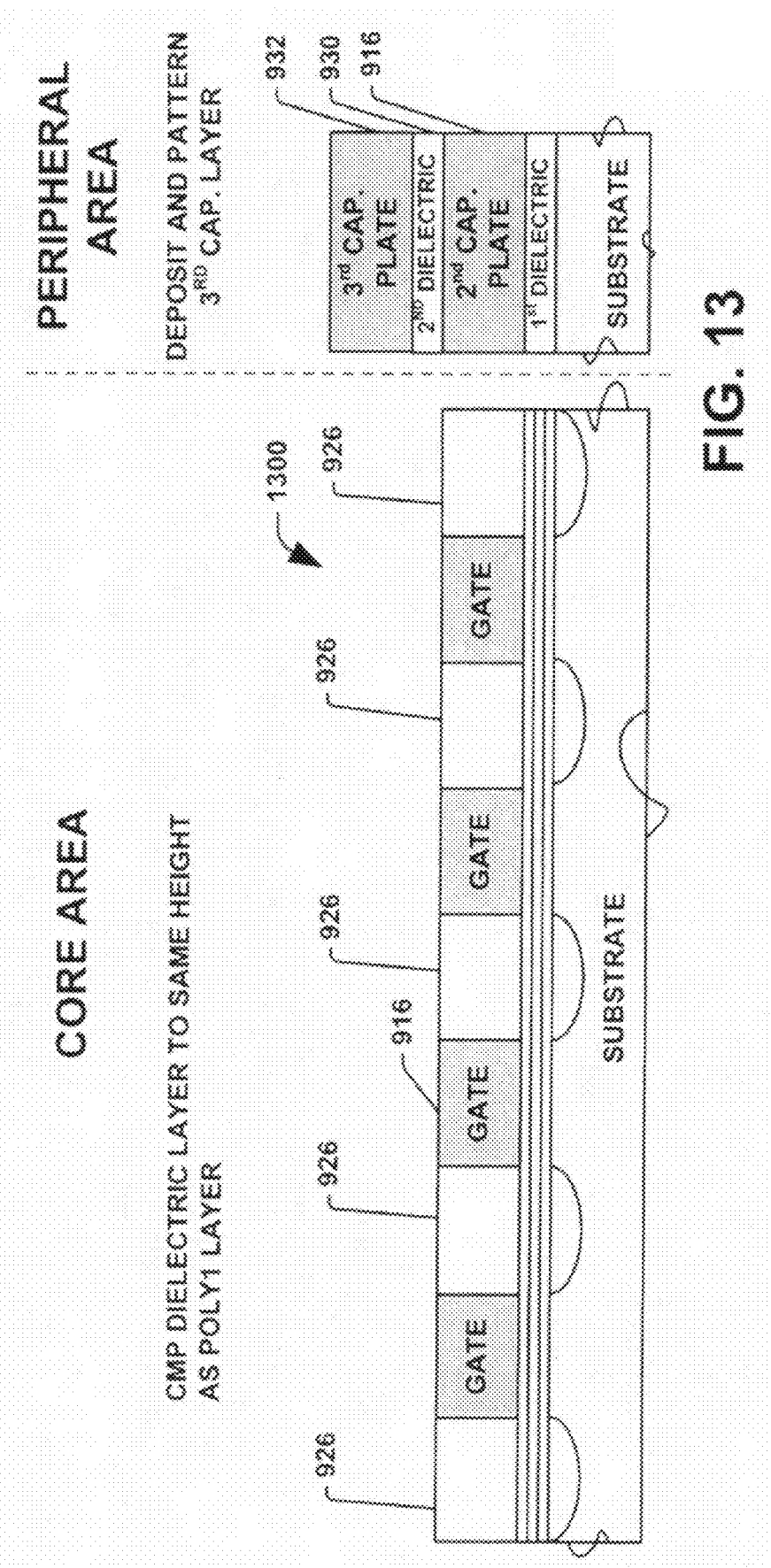
FIG. 13 is an exemplary illustration of a concurrent memory and capacitor formation, according to yet another aspect of the present invention.

Another aspect of the present invention is illustrated in FIG. 12, wherein a dielectric deposition process 928 can be utilized to create a dielectric layer 930 over the second capacitor plate 916 in the peripheral region only as illustrated, for example. The dielectric layer 930 can be formed to a thickness of approximately 50 to 300 Angstroms, for example. As with the second capacitor plate 916, a third capacitor plate layer 932 can be formed to thickness of between about 200 to 3000 Angstroms, for example. The third capacitor plate 932 serves as an additional capacitor plate. It will be appreciated that the third capacitor plate layer 932 is formed so as to increase the capacitive ability to store charge while maintaining the same footprint as a prior art capacitor.

Figure 14:
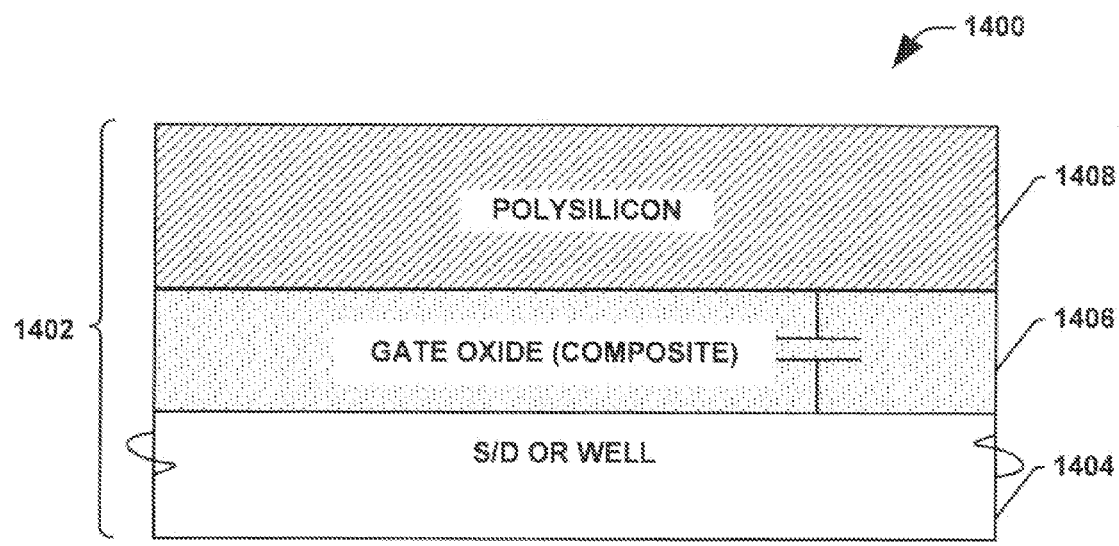
FIG. 14 is an exemplary illustration of a prior art memory and capacitor device.
Figure 15:
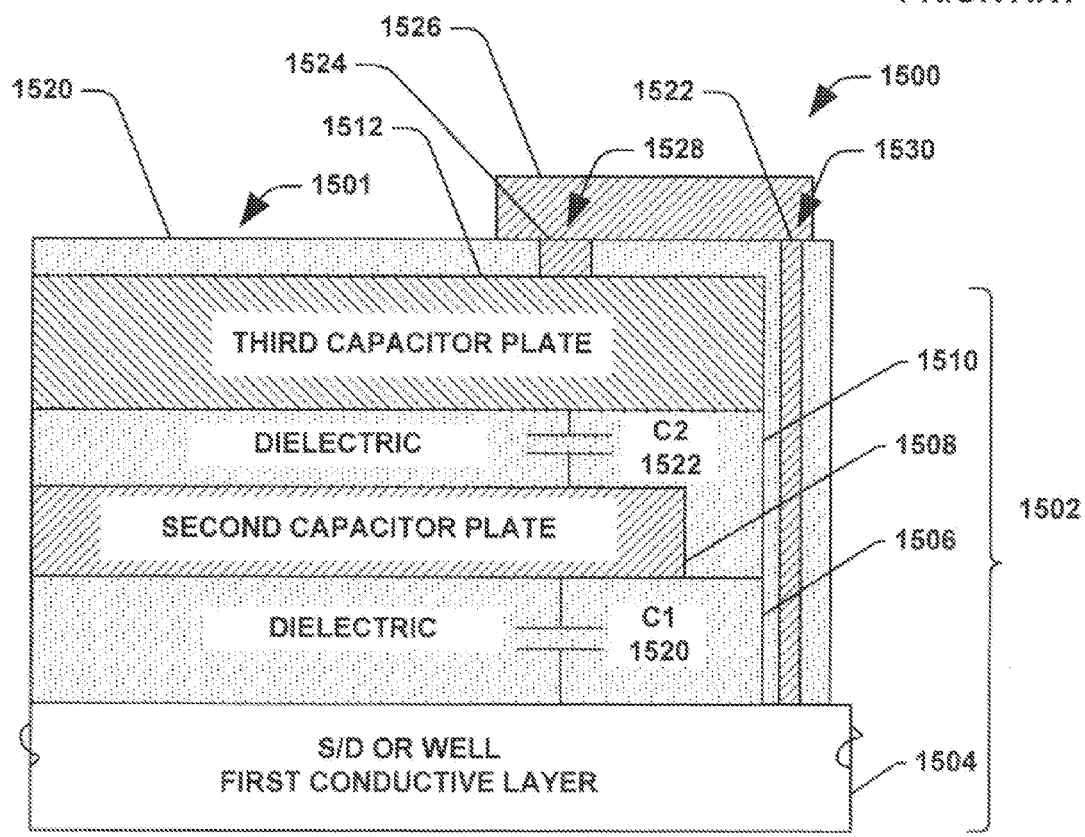
FIG. 15 is an exemplary illustration of a concurrent memory and capacitor formed according to yet another aspect of the present invention.

Illustrated in FIG. 14 is a prior art capacitor 1400 made up of a capacitor stack 1402, comprising a substrate 1404, a first dielectric layer 1406 and a second capacitor plate 1408. FIG. 15 illustrates a more efficient vertical capacitor structure 1502 formed within a semiconductor device 1500 according to more or more aspects of the present invention. In this example a vertical capacitor 1502 can use a similar foot print to the prior art capacitor shown in FIG. 14, however there is a greater capacitance because of the increased vertical structure. The capacitor 1501 of the semiconductor device 1500 is formed as a capacitor stack 1502. The capacitor stack 1502 comprises a substrate or semiconductor body 1504 (e.g., a doped source or drain, for example) disposed next to and in contact with a first dielectric layer 1506. The capacitor stack 1502 further includes a second capacitor plate 1508 (e.g., a second conductive layer) overlying the first dielectric layer 1506 (e.g., a gate oxide, etc.) and the first conductive layer or substrate 1504. The stack 1502 further includes a second dielectric layer 1510 (e.g., SPA) over the second capacitor plate 1508, for example and a portion of the first dielectric 1506. A third capacitor plate 1512 overlies the second dielectric layer 1510, for example. A third dielectric layer 1520 can be formed over the capacitor stack 1502 and the first conductive layer 1504, as illustrated.

Subsequently, a first via 1528 can be formed through the third dielectric 1520 to the third capacitor plate 1512 and a second via 1530 can be formed through the third dielectric 1520 to the semiconductor body 1504. It should be appreciated that the formation of vias is well know by those ordinary skill in the art. Metal can be deposited in the vias, 1528 and 1530, for example using techniques that are well know by those of ordinary skill in the art to form a first electrode 1522 and a second electrode 1524. The deposition can be followed by chemical mechanical polishing (CMP), for example to expose the top surface of the third dielectric layer 1520. The third capacitor plate 1512 can then be connected to the source/drain well 1504 with a metal interconnect 1526 connecting the first electrode 1522 and the second electrode 1524, as illustrated.

A C1 capacitor 1520 is formed as illustrated by utilizing the second electrode 1508 and the first electrode (1504 and 1512) separated from each other by the first dielectric layer 1506. A C2 capacitor 1522 is formed as illustrated between the electrodes (1504 and 1512) and the second capacitor plate 1508. The capacitor 1502 acts as a more efficient capacitor than does the prior art structure shown in FIG. 14.

Figure 16:
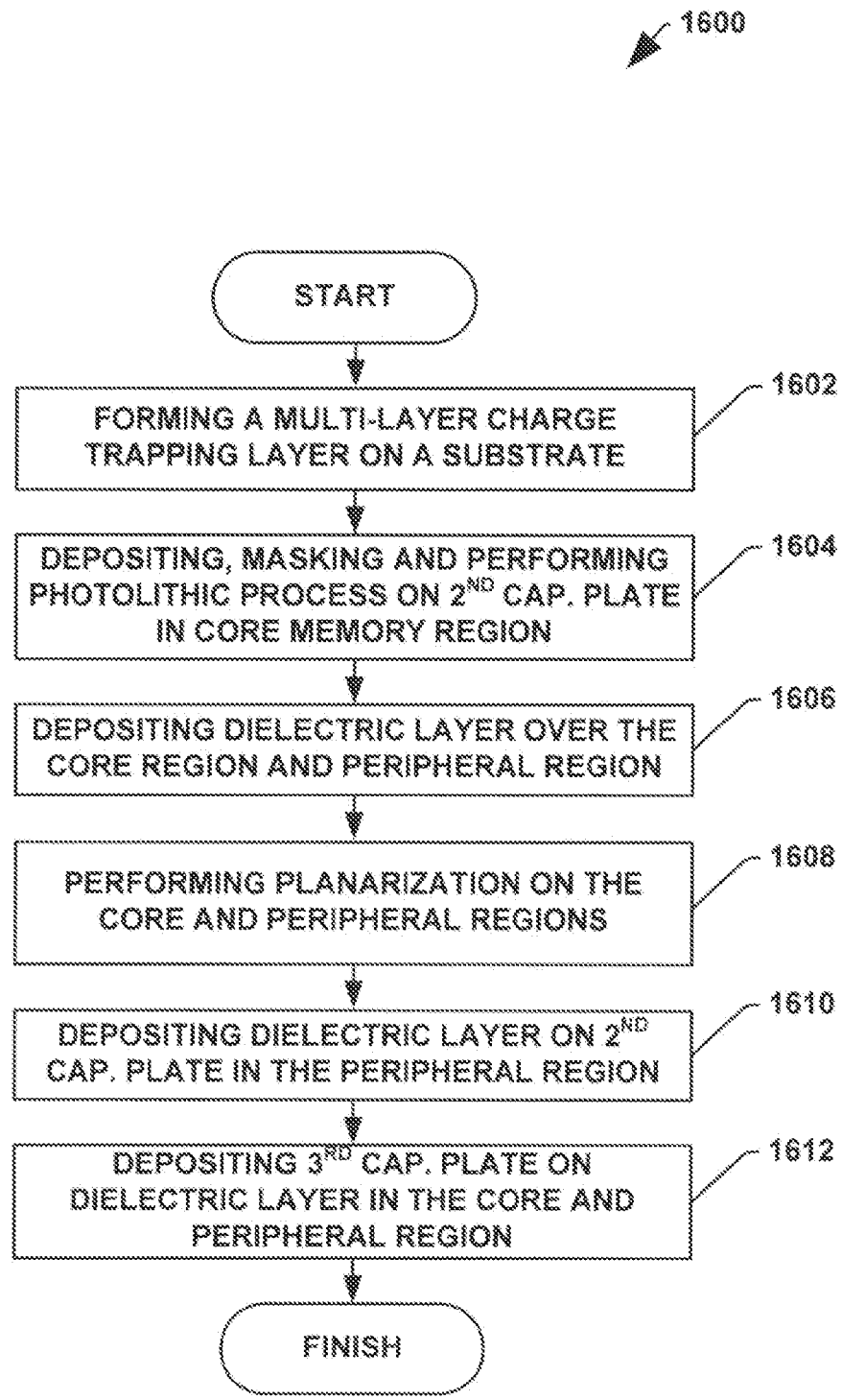
FIG. 16 is a flow chart illustrating the manufacture of a 3D capacitor structure, in accordance with an aspect of the present invention.

Turning to FIG. 16 is a flow chart diagram illustrating an exemplary method 1600 of forming a vertical capacitor structure according to at least one aspect of the present invention. FIG. 16 illustrates the concurrent formation of memory cells and a capacitor according to at least one aspect of the present invention. The method begins at 1602 where a charge-trapping composite dielectric layer can be deposited over a semiconductor substrate, for example. The charge-trapping dielectric layer generally can be composed of three separate layers, for example: a first insulating layer (e.g., oxide), a charge-trapping layer (e.g., nitride), and a second insulating layer (e.g., oxide). The oxide-nitride-oxide configuration is commonly referred to as an ONO layer for convenience. Alternatively, other types of charge-trapping layers may be employed and are contemplated as falling within the scope of the present invention.

It is to be appreciated that reference to substrate or semiconductor substrate as used herein can include a base semiconductor wafer (e.g., silicon, SiGe, or an SOI wafer) and any epitaxial layers or other type semiconductor layers formed thereover or associated therewith. It is to be further appreciated that elements depicted herein are illustrated with particular dimensions relative to one another (e.g., layer to layer dimensions and/or orientations) for purposes of simplicity and ease of understanding, and that actual dimensions of the elements may differ substantially from that illustrated herein.

At 1604 a polysilicon layer can then formed over the ONO composite charge trapping dielectric layer, for example. The polysilicon layer can be formed to a thickness of between about 500 to 1100 Angstroms, for example. A layer of hardmask material can be subsequently formed over the poly1 layer. An optional antireflective coating (ARC) layer (not shown), that may include an organic material, such as silicon nitride or silicon oxynitride, for example, can be formed over the hardmask, and a resist (also not shown) can be formed over the ARC layer to facilitate patterning the hardmask, as discussed supra. The ARC layer in particular assists with mitigating reflection during exposure and thereby improves the fidelity of pattern transfer. The hardmask can, for example, be formed from oxide based material(s) that are applied to a thickness of between about 300 to 700 Angstroms, for example.

The hardmask can then be patterned (e.g., after both the resist and optional ARC layers have been patterned, exposed, etched and/or selectively stripped to form a combined photomask for transferring the pattern onto the hardmask). An optional spacer material (e.g., of oxide and/or nitride based material) can be formed over the patterned hardmask features, for example.

The spacer material can be formed to a thickness of between about 200 to 500 Angstroms, for example. The spacer material can then be patterned (e.g., isotropically plasma etched) to form sidewall spacers adjacent to the patterned features of the hardmask, for example.

Continuing at 1604, the gates in the core region and the second capacitor plate in the peripheral region can then be patterned with the sidewall spacers serving as guides, for example. It will be appreciated that from a three dimensional perspective the gates can be patterned into parallel "strips" or wordlines of polysilicon material. The gates in the core region and the second capacitor plate in the peripheral region can be the same layer of material or can consist of two separate or different layers of material, for example. The composite charge trapping dielectric layer can be similarly patterned. It will be appreciated that the etchants utilized to remove the first and second dielectric layers can also be effective to remove the patterned hardmask features and the optional sidewall spacers since these features contain the same or a similar type of compound, namely oxide based materials. Should some traces of the hardmask features remain, these can be stripped or washed away at a later time to reveal clean gates of the memory device located in the core region. It should be noted that the second capacitor plate in the peripheral region can remain un-patterned at this time in the processing of the capacitor, according to at least one aspect of the present invention. According to yet another aspect of the present invention, an implant can be then performed to establish ii-type junctions (e.g., arsenic or phosphorus) within the p-well of the semiconductor substrate. These implantation techniques are well known by those of ordinary skill in the art.

At 1606, for example a dielectric deposition can be performed with an oxide based material to form a dielectric layer. The high temperature oxide deposition can be performed at temperatures between around 700 to 1200 degrees Celsius, for example. The deposition is performed to fill the openings within the memory devices formed within the gates with the oxide material and to cover the second capacitor plate within the peripheral region. The entire wafer (e.g., the core and peripheral regions) can then be subjected to planarization (e.g., chemical mechanical polishing (CMP)) to remove any excess oxide material and planarize the surface of the structures thereon. The dielectric layer can be polished to the original height of the gates and the second capacitor plate. It will be appreciated that in a three dimensional perspective this results in "strips" of oxide material in parallel with the patterned strips of the gates and the second capacitor plate.

Another aspect of the present invention is illustrated at 1610, wherein a dielectric deposition process can be utilized to create a dielectric layer over the second capacitor plate in the peripheral region, for example. The dielectric layer can be formed to a thickness of approximately 50 to 300 Angstroms, for example. As with the second capacitor plate, a third capacitor plate can be formed to thickness of between about 200 to 3000 Angstroms, for example. The third capacitor plate layer serves as another capacitor plate in the vertical capacitor stack. It will be appreciated that the third capacitor plate is formed so as to increase the capacitive ability to store charge while maintaining the same footprint as a prior art capacitor.

At 1612 the third capacitor plate can be deposited on the dielectric layer and tied back to the first conductive layer with a connector, for example. The third capacitor plate is connected to the source/drain well and forms a first electrode and the second capacitor plate forms a second electrode. A C1 capacitor can be formed as illustrated by utilizing the second capacitor plate electrode and the first electrode (1504 and 1512 (FIG. 15)) separated from each other by the first oxide layer 1506 (FIG. 15). A C2 capacitor can be formed as illustrated between the electrode (1504 and 1512 (FIG. 15)) and the second capacitor plate electrode. The capacitor 1502 (FIG. 15), acts as a more efficient capacitor than do the prior art capacitors. The process ends at 1612.

Figure 17:
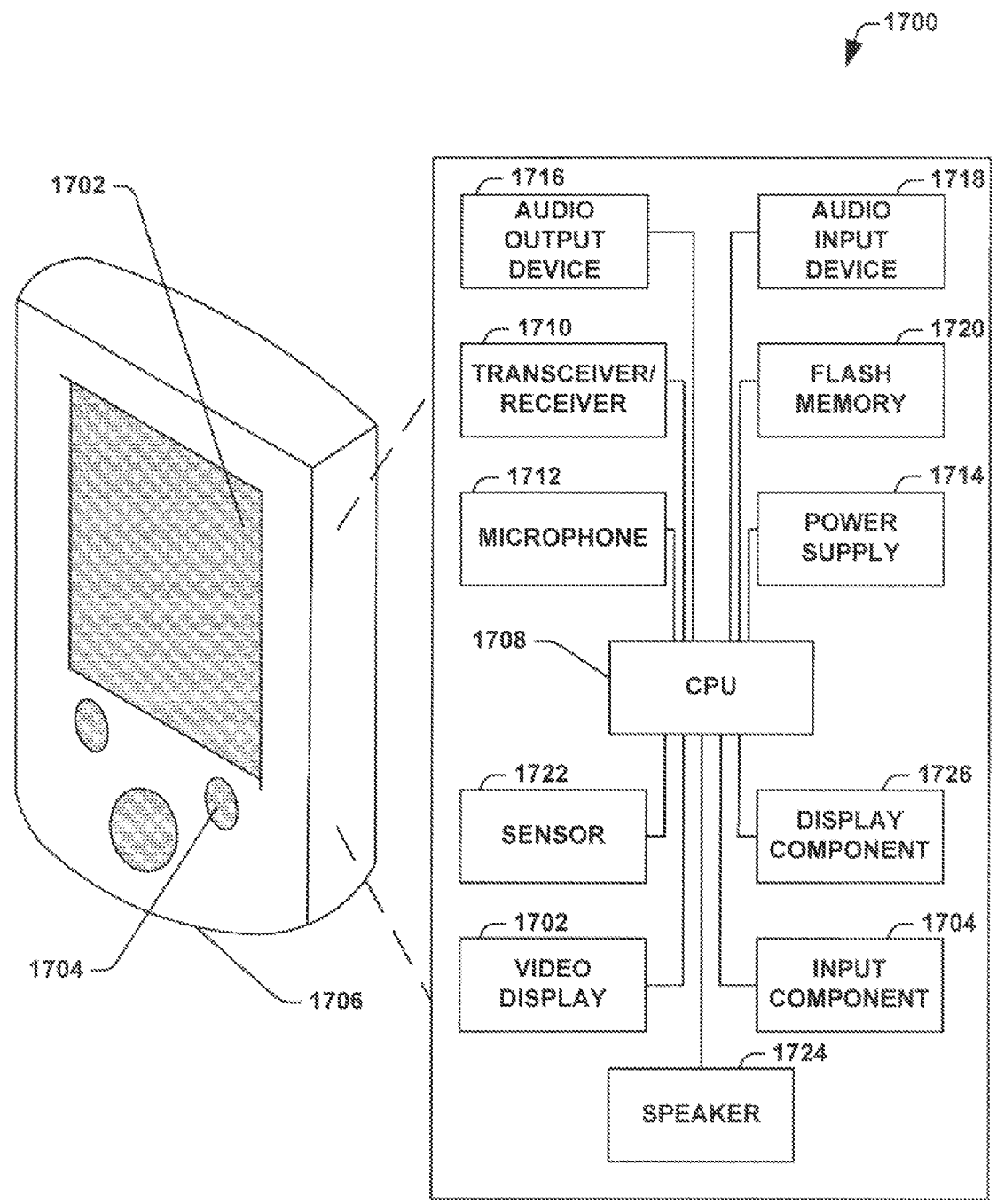
FIG. 17 is a communication device illustrating yet another aspect of the present invention.

FIG. 17 is an exemplary portable electronic device, for example, a Personal Data Assistant (PDA) 1700 comprising a video display 1702, an input component 1704, a housing 1706, a CPU 1708, a transceiver and/or a receiver 1710, a microphone 1712, a power supply 1714, an audio output device 1716, an audio input 1718, flash memory 1720, various sensors 1722, and speaker(s) 1724. The flash memory 1720 manufactured according using a thick spacer for BL implant and then remove, of the present invention. The audio input device 1718 can be a transducer, for example. The input component 1704 can include a keypad, buttons, dials, pressure keys, and the like. The video display 1702 can be a liquid crystal display, a plasma display, an LED display, and the like, for displaying visual data and information. In accordance with another embodiment of the claimed subject matter, the portable device with flash memory 1720 manufactured according to a thick spacer for BL implant and then remove method, of the present invention, comprises cell phones, memory sticks, flash drive devices, video camcorders, voice recorders, USB flash drives, fax machines, flash memory laptops, MP3 players, digital cameras, home video game consoles, hard drives, memory cards (used as solid-state disks in laptops), and the like. The flash memory 1720 can include random access memory, read only memory, optical memory, audio memory, magnetic memory, and the like.

According to one embodiment of the present invention, the CPU 1708 is configured to communicate with the audio input device 1718, the audio output device 1716 and a display component 1726. The display component 1726 can be separate and distinct from the video display 1702. The CPU 1708 can execute control functions based on inputs from the user, entered using the input component 1704, for example. Based on those inputs, for example the display component can display a graph, a photo, a map, a chart a video, and the like. The PDA 1700 is also configured to output data as an audio signal, for example a song, a message, a warning sound, various tones, recordings, etc. In another embodiment of the present invention the PDA 1700 can communicate with other electronic devices, for example computers, cell phones, other PDAs, and the like. The PDA 1700 is also configured to transmit digital data wirelessly from one user to another. This is done utilizing the transmitter/receiver 1710 to either transmit or receive data. Additionally, sensors 1722 can be utilized to sense data external to the PDA 1700, for example, temperatures, radiation levels, pressures, and the like it will be further appreciated that any of the layers described herein can be formed in any one or more suitable manners, either alone or in combination, such as with spin-on techniques, sputtering techniques (e.g., magnetron or ion beam sputtering), growth and or deposition techniques such as chemical vapor deposition (CVD) and/or low pressure chemical vapor deposition (LPCVD), for example.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has" "with", or variants thereof are used in either the detailed description and, the claims, such terms are intended to be inclusive in a manner similar to the term "comprising".

What is claimed is:

1. A method of forming a capacitor for use as a charge pump with flash memory, comprising:
   forming a first polysilicon layer over a semiconductor body;
   patterning the first polysilicon layer into a polysilicon gate disposed over a core region of the semiconductor body and a first polysilicon capacitor plate disposed over a peripheral region of the semiconductor body;
   forming a first dielectric layer over the polysilicon gate and the first polysilicon capacitor plate;
   planarizing the first dielectric layer to expose a top portion of the polysilicon gate and a top portion of the first polysilicon capacitor plate;
   forming a second dielectric layer over the top portion of the first polysilicon capacitor plate;
   forming a second polysilicon layer over the top portion of the polysilicon gate and over the second dielectric layer;
   patterning a portion of the second polysilicon layer over the second dielectric layer to form a second capacitor plate in the periphery region; and
   electrically connecting the second capacitor plate to the semiconductor body.

2. The method of claim 1, wherein the first dielectric layer comprises: a gate oxide, silicon, silicon dioxide, silicon nitride, silicon oxynitride, and aluminum oxide.

3. The method of claim 1, wherein the second dielectric layer comprises: gate oxide, silicon, silicon dioxide, silicon nitride, silicon oxynitride, and aluminum oxide.

4. The method of claim 1, where the first polysilicon capacitor plate and the second capacitor plate form a capacitor that is configured to deliver a pulse for a program or erase operation.

5. A method of forming a capacitor for use in flash memory, comprising:
   forming a first dielectric layer over a core region and a peripheral region of a semiconductor body;
   forming a first polysilicon layer over the first dielectric layer;
   patterning the first polysilicon layer to form a gate over the core region and a first capacitor plate over the periphery region;
   forming source/drain regions in the core region about opposing sides of the gate;
   forming a second dielectric layer over both the gate and the first capacitor plate;
   planarizing the second dielectric layer to expose a top portion of the gate and a top portion of the first capacitor plate;
   forming a third dielectric layer over the top portion of the first capacitor layer;
   forming and patterning a second polysilicon layer extending over the gate and over the third dielectric layer; and
   electrically connecting the second polysilicon layer over the third dielectric layer to the semiconductor body.

* * * * *